(12) United States Patent
Jaussi et al.

(10) Patent No.: US 7,173,460 B2
(45) Date of Patent: Feb. 6, 2007

(54) SAMPLING PHASE DETECTOR FOR DELAY-LOCKED LOOP

(75) Inventors: James E. Jaussi, Hillsboro, OR (US); Randy R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 49 days.

(21) Appl. No.: 11/103,527

(22) Filed: Apr. 12, 2005

(65) Prior Publication Data

US 2006/0226881 A1 Oct. 12, 2006

(51) Int. Cl.
*H03L 7/06* (2006.01)

(52) U.S. Cl. .................... 327/149; 327/158

(58) Field of Classification Search ........... 327/149, 327/158, 153, 161, 163; 331/17, 25, DIG. 2; 375/373–376
See application file for complete search history.

(56) References Cited

U.S. PATENT DOCUMENTS

| 6,424,193 | B1 * | 7/2002 | Hwang | 327/158 |
| 7,034,591 | B2 * | 4/2006 | Wang | 327/158 |

OTHER PUBLICATIONS

"A Semidigital Dual Delay-Locked Loop", Stefanos Sidiropoulos, et al., IEEE Journal of Solid-State Circuits, vol. 32, No. 11, Nov. 1997.
"Low-Jitter Process-Independent DLL and PLL Based on Self-Biased Techniques", John G. Maneatis, IEEE Journal of Solid-State Circuits, vol. 31, No. 11, Nov. 1996.
"3.3V, 1.6 GHz, Low-Jitter, Self-Correcting DLL Based Clock Synthesizer in 0.5μm CMOS.", David J. Foley, et al., , ISCA 2000-IEEE International Symposium on Circuits and Systems, May 28-31, 2000, Geneva, Switzerland.

* cited by examiner

*Primary Examiner*—Linh My Nguyen
(74) *Attorney, Agent, or Firm*—Fleshner & Kim, LLP

(57) ABSTRACT

A delay-locked loop (DLL) architecture is provided that includes a voltage controlled delay line, a sample-and-hold circuit and an amplifier circuit. The voltage controlled delay line may have a plurality of buffer stages to provide a first clock signal and a second clock signal. The sample-and-hold circuit may receive signals corresponding to the first clock signal and the second clock signal. The sample-and-hold circuit may provide two sampled signals based on the received signals. Additionally, the amplifier circuit may be coupled to the sample-and-hold circuit and the voltage controlled delay line. The amplifier circuit may provide a control voltage to the buffer stages of the voltage controlled delay line based on the sampled signals received from the sample-and-hold circuit.

24 Claims, 4 Drawing Sheets

SAMPLING PHASE DETECTOR FOR DELAY-LOCKED LOOP

FIELD

Embodiments of the present invention relate to circuits. More specifically, embodiments of the present invention may relate to delay-locked loops.

BACKGROUND

Phase-locked loops (PLLs) and delay-locked loops (DLLs) may be employed in processor and memory integrated circuits to cancel on-chip clock amplification and buffering delays and to improve input/output (I/O) timing margins. DLLs may offer an alternative to PLLs due to their better jitter performance, inherent stability and simpler design. DLLs may lock to a specific frequency and have a known delay through a voltage control delay line (VCDL). One implementation of a DLL may be to have an input signal (i.e., a clock phase 0 signal) received by a VCDL that outputs a clock phase 180 signal. A DLL may attempt to "lock" the clock phase 0 signal and the clock phase 180 signal by comparing edges of each of these signals.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

Figure 1:
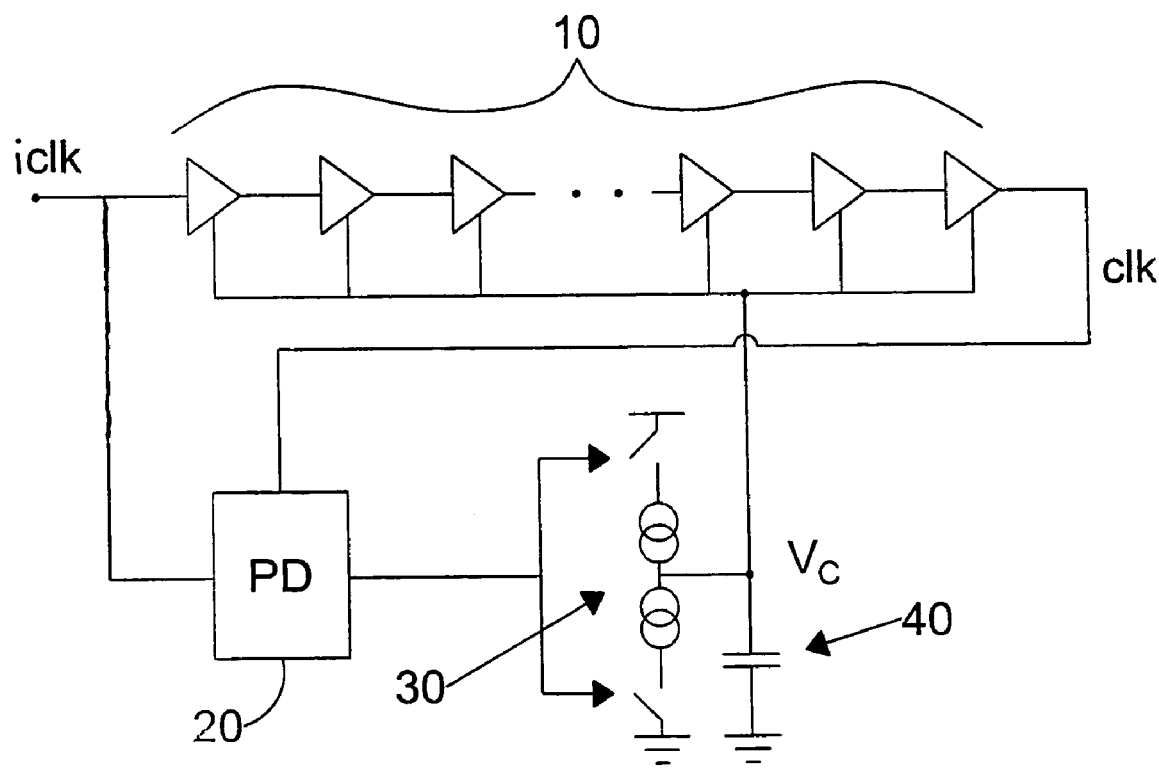
FIG. 1 shows a delay-locked loop architecture according to an example arrangement.

In the following detailed description, like reference numerals and characters may be used to designate identical, corresponding or similar components in differing figure drawings. Well-known power/ground connections to integrated circuits (ICs) and other components may not be shown within the figures for simplicity of illustration and discussion. Where specific details are set forth in order to describe example embodiments of the invention, it should be apparent to one skilled in the art that the invention can be practiced without these specific details.

Further, arrangements and embodiments may be described with respect to signal(s) and/or signal line(s). The identification of a signal or signal line may correspond to a single signal or a single signal line or may be a plurality of signals or signal lines. Additionally, the terminology of signal(s) and signal line(s) may be used interchangeably.

FIG. 1 shows a delay-locked loop architecture according to an example arrangement. Other arrangements and configurations are also possible. More specifically, FIG. 1 shows that a delay-locked loop architecture may include a voltage controlled delay line (VCDL) 10, a phase detector (PD) 20, a charge pump (CP) 30 and a first-order loop filter 40. The VCDL 10 includes a plurality of cascaded variable delay buffers that are shown generally as element 10. Each of the buffers may also be referred to as a buffer cell or buffer stage.

An input clock signal (iclk) drives the VCDL 10 by applying the input clock to the first buffer stage of the VCDL 10. The input clock signal passes through the plurality of buffer stages to a final stage of the VCDL 10. An output clock signal (clk) drives the phase detector 20. The output of the phase detector 20 may be integrated by the charge pump 30 and the loop filter 40 to generate a control voltage $V_C$ that is applied to each of the buffer stages of the VCDL 10. The feedback loop drives the control voltage $V_C$ to a value that forces a zero phase error between the output clock (clk) and the input clock (iclk) or the reference clock (refclk) applied to the PD 20.

Figure 2:
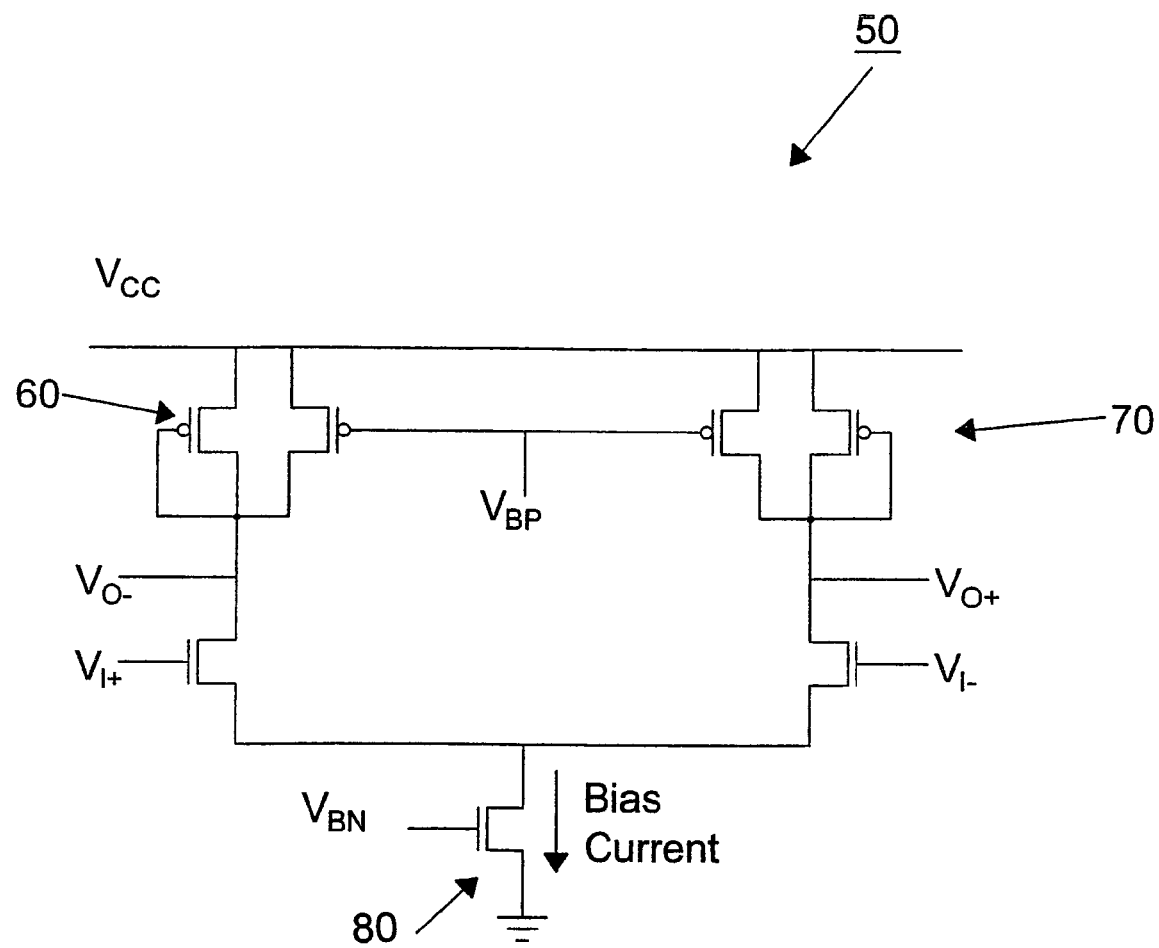
FIG. 2 shows a delay buffer stage of a VCDL according to an example arrangement.

FIG. 2 shows a delay buffer stage of a VCDL according to an example arrangement. Other arrangements and configurations are also possible. More specifically, FIG. 2 shows a differential buffer stage 50 having symmetric loads 60 and 70. As shown, the buffer stage 50 may receive differential inputs $V_{i+}$ and $V_{i-}$ and provide differential outputs $V_{o+}$ and $V_{o-}$. In this example, the differential inputs are provided to n-channel metal oxide semiconductor (NMOS) devices. Each of the symmetric loads 60 and 70 may include a diode-connected p-channel metal oxide semiconductor (PMOS) device in shunt with an equally sized PMOS device. A PMOS bias voltage $V_{BP}$ may correspond to a control voltage $V_C$ (and be provided to a gate of one of the PMOS transistors within each of the symmetric loads 60 and 70). The control voltage $V_C$ may define a lower voltage swing limit of the output of the buffer stage 50. The buffer delay may change with the control voltage $V_C$ since an effective resistance of the load elements also may change with the control voltage $V_C$.

An n-channel metal oxide semiconductor (NMOS) current source 80 may be dynamically biased with a bias voltage $V_{BN}$ to compensate for drain and substrate voltage variations, achieving the effective performance of a cascade current source. Although not shown, a level shift circuit (or level converter) may convert the differential outputs of the VCDL stages to CMOS levels. However, errors may be introduced by level conversion, which leads to uncertainty.

Additionally, while not shown, the FIG. 2 arrangement may also be implemented having PMOS inputs and NMOS loads.

Embodiments of the present invention may provide a low-swing implementation of a delay-locked loop architecture. Embodiments of the present invention may be provided without a phase detector and without a level converter (or level shift circuit) in order to provide a low-swing implementation. Rather, embodiments of the present invention may include an amplifier that acts as an analog phase detector that accepts non-CMOS signals as inputs (as compared to CMOS rail-to-rail inputs from a level converter). The input levels of the amplifier may be in a range of approximately $V_{CC}/2$ to GROUND (as compared to a range of $V_{CC}$ to GROUND). Embodiments of the present invention may sample analog voltages of a clock phase 0 signal and a clock phase 360 signal. The analog voltage may be integrated onto an input stage of an amplifier that controls a delay through a voltage controlled delay line so as to make a voltage (i.e., an area) difference between the clock phase 0 signal and the clock phase 360 signal be zero.

Figure 3:
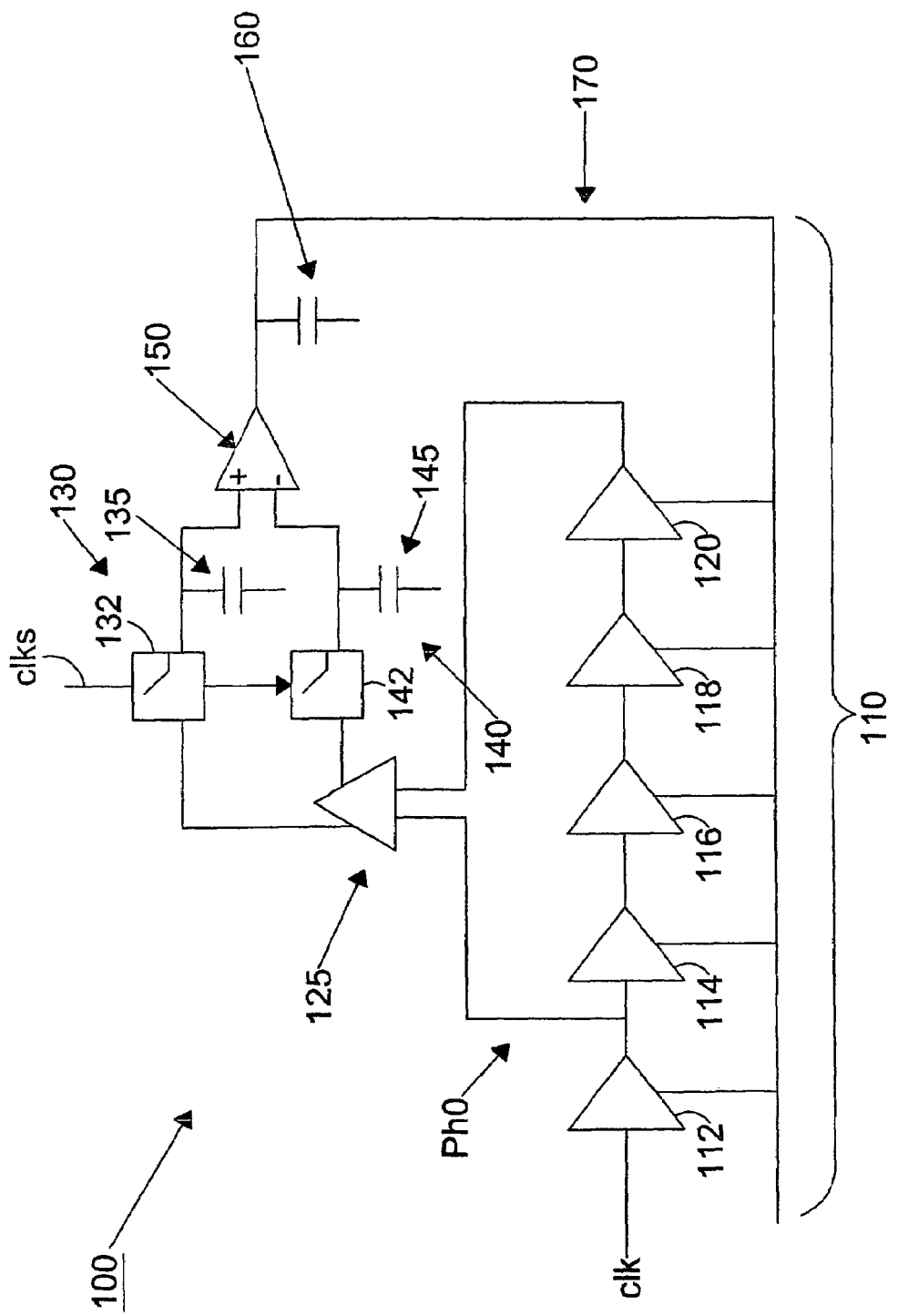
FIG. 3 shows a delay-locked loop architecture according to an example embodiment of the present invention.

FIG. 3 shows a delay-locked loop architecture according to an example embodiment of the present invention. Other embodiments and configurations are also within the scope of the present invention. More specifically, FIG. 3 shows a delay-locked loop (DLL) architecture 100 having a voltage controlled delay line (VCDL) 110 that includes a plurality of buffer stages 112, 114, 116, 118 and 120. Each of the buffer stages 112, 114, 116, 118 and 120 may be considered one of a plurality of cascaded variable delay buffers. Further, the buffer stage 112 may not be considered as part of the VCDL 110 in at least one embodiment. Other numbers of buffer stages are also within the scope of the present invention. While not shown specifically in this figure, the VCDL 110 operates based on differential signals. That is, each buffer stage (or delay cell) may output two differential signals.

The first buffer stage 112 may receive a clock signal (clk) and output a clock phase 0 signal (shown as Ph0) as well as its differential phase 180 signal. The signal propagates through the VCDL 110. At the other end of the VCDL 110, a clock phase 360 signal (shown as Ph360) and its differential clock phase 180 signal may be provided by the fifth buffer stage 120. The clock Ph0 signal from the buffer stage 112 and the clock Ph360 signal from the buffer stage 120 may be input to a buffer circuit 125. As one example, the buffer circuit 125 may be a differential input stage having two diode loads (not shown in FIG. 3). The buffer circuit 125 may provide differential output signals to sample-and-hold circuits 130 and 140. In the embodiment shown in FIG. 3, only one of the differential signals is provided from the buffer stage 112 to the buffer circuit 125 and only one of the differential signals is provided from the buffer stage 120 to the buffer circuit 125. The buffer circuit 125 may be provided as an intermediate stage (or intermediate circuit) between the VCDL 110 and the sample-and-hold circuits 130, 140 so that the phase signals from the VCDL 110 are not directly input to the sample-and-hold circuits 130, 140. As another example, the buffer circuit 125 may be a differential amplifier.

The sample-and-hold circuit 130 may include a switch 132 and a corresponding capacitor 135 and the sample-and-hold circuit 140 may include a switch 142 and a corresponding capacitor 145. The sample-and-hold circuit 130 (including the capacitor 135) is coupled to a non-inverting input (+) of a differential amplifier 150 and the sample-and-hold circuit 140 (including the capacitor 145) is coupled to an inverting input (−) of the differential amplifier 150.

The sample-and-hold circuits 130 and 140 operate based on a sample clock signal ($clk_s$). The sample clock signal ($clk_s$) may be a phase output signal of one of the buffer stages of the VCDL 110. As one example, the sample clock signal ($clk_s$) may correspond to an output from the buffer stage 116 provided in a middle of the overall VCDL 110.

The sampled voltages of the sample-and-hold circuits 130, 140 are applied to the differential amplifier 150. The differential amplifier 150 provides an output signal across a loop filter 160 (shown as a capacitor) and a delay control line 170 to each of the buffer stages 112, 114, 116, 118 and 120 of the VCDL 110. The signal along the delay control line 170 is a control voltage to modulate delay through the buffer stages. More specifically, the control voltage aligns the clock phase 0 signal output from the buffer stage 112 and the clock phase 360 signal output from the buffer stage 120 through closed-loop feedback control. For example, as the control voltage changes, the delay through the VCDL 110 also changes.

More specifically, the DLL architecture 100 operates such that due to the differential aspects, when the clock phase 0 signal and the clock phase 360 signal are in phase with each other (i.e., their edges line up), then a zero differential signal is output from the amplifier 150.

Each of the sample-and-hold circuits 130 and 140 may operate for half a period while looking for an edge crossing. That is, a state of an input signal to a sample-and-hold circuit may be held for half a period so that the differential amplifier 150 has time in which to feed back the appropriate signal for voltage control of the delay. Stated differently, each of the sample-and-hold circuits 130, 140 may sample signals for half a cycle time and hold signals for half a cycle time.

Each of the switches 132 and 134 may be an NMOS switch in which a drain is coupled to receive an input signal (from the buffer circuit 125), a source is coupled to the amplifier 150 and a gate is coupled to receive the sample clock signal $clk_s$. Thus, when the voltage of the gate of one of the NMOS switches goes HIGH (i.e., above a threshold), then the corresponding capacitor 135, 145 may be charged (to as high as a gate threshold voltage of the switch). When the voltage of the gate of that NMOS switch later goes LOW (i.e., below a threshold), then the voltage on the corresponding capacitor 135, 145 may be held.

The differential amplifier 150 may provide an output signal (i.e., the control voltage) based on the signals provided to the input terminals. Thus, when edges of the input signals properly align, a zero differential signal is output from the differential amplifier 150 as the control voltage. On the other hand, when the edges of the input signals are misaligned, then an appropriate control voltage is output so as to control the delay through the VCDL 110.

Embodiments of the present invention may provide a DLL architecture having a lower power, a higher bandwidth and higher resolution. The higher resolution may also translate into a lower deadband. Embodiments of the present invention may also be used in high data rate parts. Still further, embodiments of the present invention may operate without a bang-bang phase detector. Embodiments of the present invention may also use their own sampling phases to sample clock phase 0 and clock phase 360.

Figure 4:
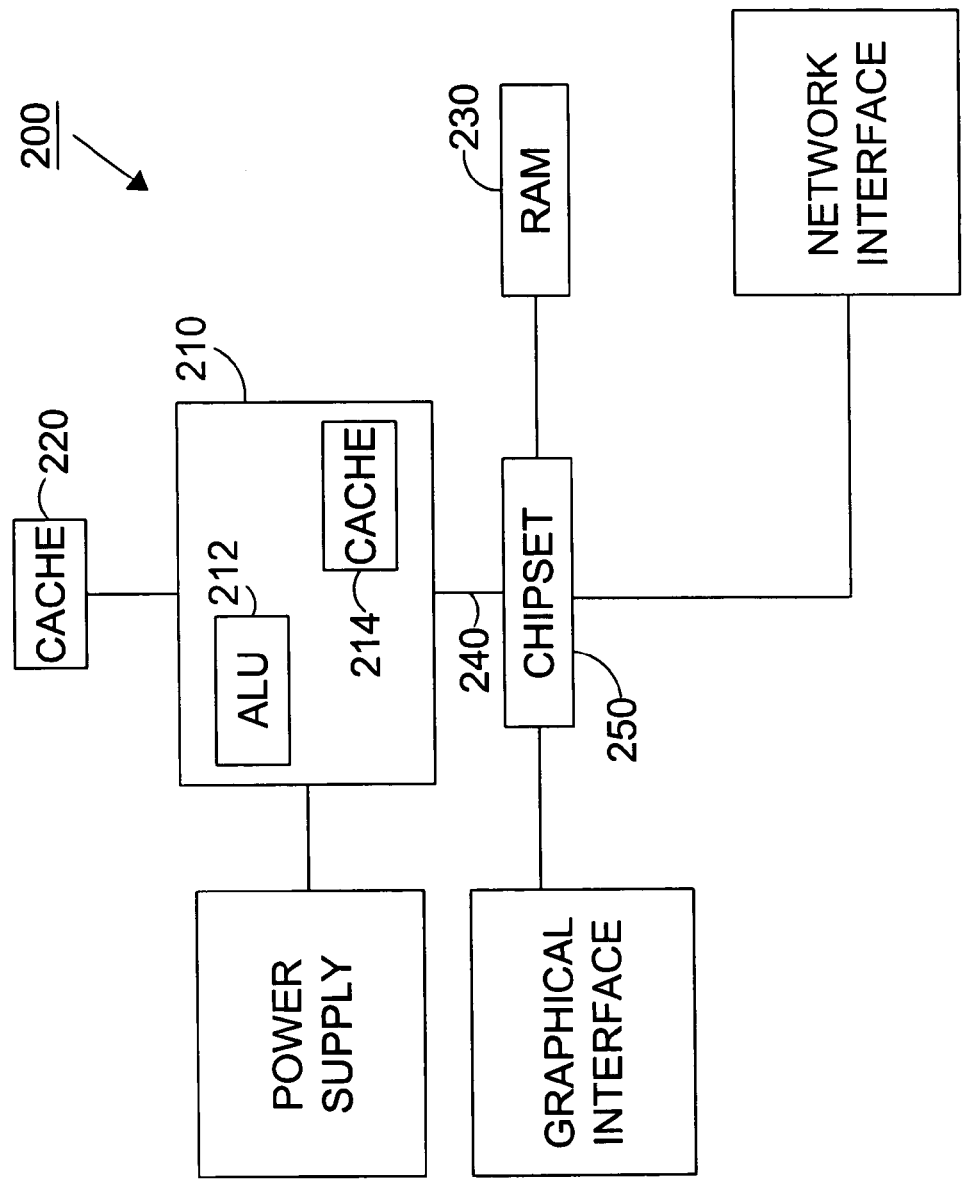
FIG. 4 is a system level block diagram according to an example embodiment of the present invention.

FIG. 4 is a system level block diagram of a system (such as a computer system 200) according to example embodiments of the present invention. Other embodiments and configurations are also within the scope of the present invention. More specifically, the computer system 200 may include a processor 210 that may have many sub-blocks such as an arithmetic logic unit (ALU) 212 and an on-die (or internal) cache 214. The processor 210 may also communicate to other levels of cache, such as off-die cache 220. Higher memory hierarchy levels such as a system memory (or RAM) 230 may be accessed via a host bus 240 and a chip set 250. The system memory 230 may also be accessed in other ways, such as directly from the processor 210 and/or without passing through the host bus 240 and/or the chip set 250. In addition, other off-die functional units such as a graphics accelerator and a network interface controller, to name just a few, may communicate with the processor 210 via appropriate busses or ports. The system may also include a wireless interface to interface the system with other systems, networks, and/or devices via a wireless connection.

A DLL architecture according to an example embodiment of the present invention may be used to generate timing and/or clock signals for controlling operations of chipset or processor, or for controlling the transfer of data between either of these elements and the memory. Those skilled in the art can appreciate that these applications are only illustrative, as embodiments of the present invention may be applied in such a processing system to generate any type of timing or clock signals required.

Embodiments of the present invention may also be provided within any of a number of example electronic systems including electrical and/or optical interconnection and communication products. Examples of represented systems include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A delay-locked loop (DLL) architecture comprising:
   a voltage controlled delay line having a plurality of buffer stages, the voltage controlled delay line providing a first clock signal and a second clock signal;
   a sample-and-hold circuit to receive two signals based on the first clock signal and the second clock signal, the sample-and-hold circuit to provide two sampled signals based on the received two signals; and
   an amplifier circuit coupled to the sample-and-hold circuit and the voltage controlled delay line, the amplifier circuit to receive the two sampled signals and to provide a control voltage to the buffer stages of the voltage controlled delay line based on the two sampled signals.

2. The DLL architecture of claim 1, wherein the control voltage controls a delay of the voltage controlled delay line.

3. The DLL architecture of claim 2, wherein the control voltage controls a delay of the voltage controlled delay line so as to align the first clock signal and the second clock signal.

4. The DLL architecture of claim 1, wherein the DLL architecture is provided without a level converter.

5. The DLL architecture of claim 1, further comprising an intermediate circuit coupled between the voltage controlled delay line and the sample-and-hold circuit, the intermediate circuit receiving the first clock signal and the second clock signal from two separate buffer stages and providing the two signals to the sample-and-hold circuit.

6. The DLL architecture of claim 5, wherein the sample-and-hold circuit includes:
   a first switch device to receive a first one of the two signals from the intermediate circuit;
   a first storage device to charge a voltage passing through the first switch device based on the first one of the two signals, and the first storage device to discharge the voltage to one input terminal of the amplifier circuit;
   a second switch device to receive a second one of the two signals from the intermediate circuit; and
   a second storage device to charge a voltage passing through the second switch device based on the second one of the two signals, and the second storage device to discharge a voltage to another input terminal of the amplifier circuit.

7. The DLL architecture of claim 6, wherein the first switch device and the second switch device each comprise an n-channel metal oxide semiconductor (NMOS) switch.

8. The DLL architecture of claim 1, wherein the sample-and-hold circuit operates based on a sample clock signal output from one of the buffer stages.

9. The DLL architecture of claim 1, wherein the sample-and-hold circuit samples signals for approximately half a cycle time and holds signals for approximately half a cycle time.

10. The DLL architecture of claim 1, wherein the first clock signal and the second clock signal are differential signals.

11. A delay-locked loop (DLL) method comprising:
    receiving a first clock signal from a first buffer of a voltage controlled delay line;
    receiving a second clock signal from a second buffer of the voltage controlled delay line;
    sampling portions of the first clock signal and the second clock signal;
    comparing the sampled portions of the first clock signal and the second clock signal; and
    providing a control voltage for the voltage controlled delay line based on the compared sampled portions.

12. The DLL method of claim 11, wherein providing the control voltage controls a delay of the voltage controlled delay line.

13. The DLL method of claim 11, wherein providing the control voltage controls a delay of the voltage controlled delay line so as to align the first clock signal and the second clock signal.

14. The DLL method of claim 11, wherein the first clock signal and the second clock signal are received from two separate buffer stages of the voltage controlled delay lines and the method further comprises providing two signals for the sampling based on the received first clock signal and the received second clock signal.

15. The DLL method of claim 14, wherein the sampling includes:
    receiving a first one of the two signals at a first switch device;
    charging a voltage passing through the first switch device based on the first one of the two signals and discharging the voltage to one input terminal of an amplifier;
    receiving a second one of the two signals at a second switch device; and charging a voltage passing through the second switch device based on the second one of the two signals and discharging the voltage to another input terminal of the amplifier.

16. The DLL method of claim 11, wherein the sampling comprises sampling signals for approximately half a cycle time and holding signals for approximately half a cycle time.

17. An electronic system comprising:
a wireless interface device to send or receive signals;
a die coupled to the wireless interface device, the die including a delay-locked loop (DLL) device and a device to receive an output signal of the DLL device, the DLL device including:
a delay line having a plurality of buffer stages and providing a first clock signal and a second clock signal;
a sampling circuit to receive two signals corresponding to the first clock signal and the second clock signal, the sampling circuit to provide two sampled signals based on the received two signals; and
an amplifier circuit coupled to the sampling circuit and the delay line, the amplifier circuit to receive the two sampled signals and provide a control voltage to the delay line based on the sampled signals received from the sampling circuit.

18. The electronic system of claim 17, wherein the DLL device further includes an intermediate circuit coupled between the delay line and the sampling circuit, the intermediate circuit receiving the first clock signal and the second clock signal from two separate buffer stages of the delay line and providing the two signals to the sampling circuit.

19. The electronic system of claim 18, wherein the sampling circuit includes:
a first switch device to receive a first one of the two signals from the intermediate circuit;
a first storage device to charge a voltage passing through the first switch device based on the first one of the two signals, and the first switch device to discharge the voltage to one input terminal of the amplifier circuit;
a second switch device to receive a second one of the two signals from the intermediate circuit; and
a second storage device to charge a voltage passing through the second switch device based on the second one of the two signals, and the second switch device to discharge a voltage to another input terminal of the amplifier circuit.

20. The electronic system of claim 17, wherein the control voltage controls a delay of the delay line so as to align the first clock signal and the second clock signal.

21. The electronic system of claim 17, wherein the first clock signal is provided from one of the buffer stages and the second clock signal is provided from another one of the buffer stages.

22. The electronic system of claim 17, wherein the sampling circuit includes:
a first switch device to receive a first one of the two signals;
a first storage device to store a voltage passing through the first switch device based on the first one of the two signals, and the first storage device to discharge the voltage to one input terminal of the amplifier circuit;
a second switch device to receive a second one of the two signals; and
a second storage device to store a voltage passing through the second switch device based on the second one of the two signals, and the second storage device to discharge the voltage to another input terminal of the amplifier circuit.

23. The DLL architecture of claim 1, wherein the first clock signal is provided from one of the buffer stages and the second clock signal is provided from another one of the buffer stages.

24. The DLL architecture of claim 1, wherein the sample-and-hold circuit includes:
a first switch device to receive a first one of the two signals;
a first storage device to store a voltage passing through the first switch device based on the first one of the two signals, and the first storage device to discharge the voltage to one input terminal of the amplifier circuit;
a second switch device to receive a second one of the two signals; and
a second storage device to store a voltage passing through the second switch device based on the second one of the two signals, and the second storage device to discharge the voltage to another input terminal of the amplifier circuit.

* * * * *